United States Patent [19]

Grundy

[11] 4,092,183
[45] May 30, 1978

[54] DIRECTIONALLY SOLIDIFIED CASTINGS

[75] Inventor: Eric Grundy, Great Haywood, England

[73] Assignee: The International Nickel Company, Inc., New York, N.Y.

[21] Appl. No.: 743,650

[22] Filed: Nov. 22, 1976

[30] Foreign Application Priority Data

Nov. 28, 1975 United Kingdom ............... 49032/75

[51] Int. Cl.² .............................................. C22C 19/05
[52] U.S. Cl. .................................... 148/32; 75/134 F; 75/171; 148/32.5
[58] Field of Search ..................... 75/171, 170, 134 F; 148/32, 32.5

[56] References Cited

U.S. PATENT DOCUMENTS 4,012,241  3/1977  Lemkey ................................. 148/32

Primary Examiner—R. Dean
Attorney, Agent, or Firm—R. J. Kenny; E. C. MacQueen

[57] ABSTRACT

High-strength, heat-resistant and corrosion-resistant castings, e.g., gas turbine blades, are composed of monovariant nickel-chromium-molybdenum basic eutectic alloy composition directionally solidified in microstructure having lamellar fibrous phase dispersed in alloy matrix.

10 Claims, 1 Drawing Figure

U.S. Patent    May 30, 1978    4,092,183
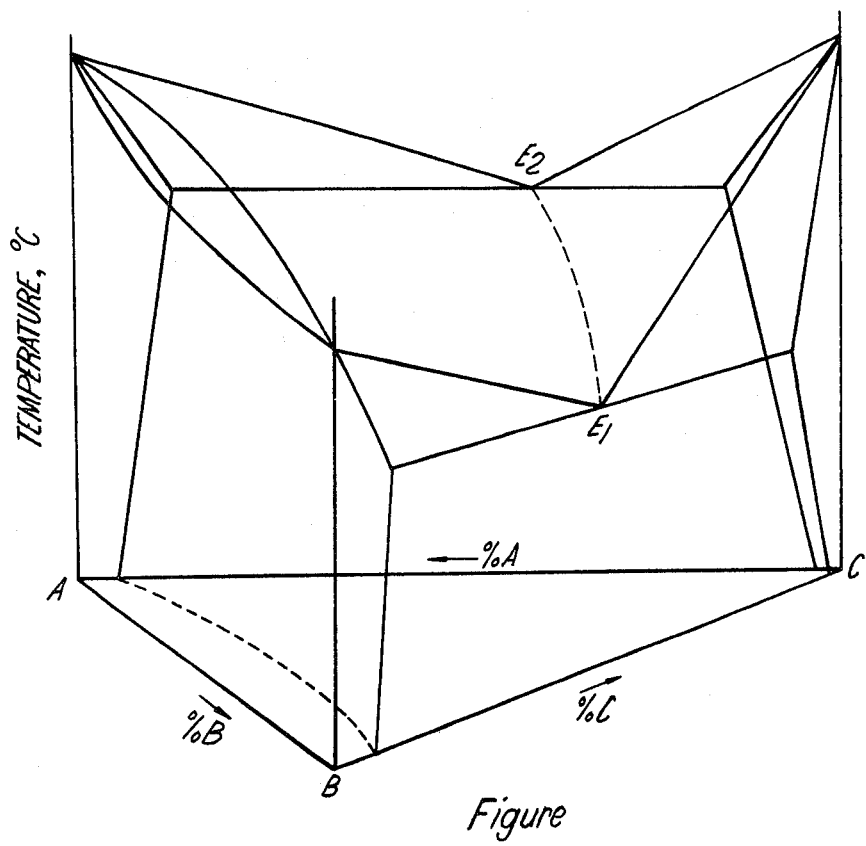
Figure

DIRECTIONALLY SOLIDIFIED CASTINGS

The present invention relates to castings and more particularly to castings prepared by the unidirectional solidification of alloys.

There is a continuing demand for materials capable of withstanding higher operating temperatures as conventional alloys, for example nickel-base alloys used for the blades of gas turbine engines, approach their operation limit. The need for alloys which are capable of operating at higher temperatures has to some extent been circumvented in instances of cast components by the use of new design features such as cooling passages within the blades. However, to improve the mechanical properties of the alloys or to allow the alloys to be subjected to higher operating temperatures necessitates the use of new alloys or new manufacturing techniques.

One such technique is the unidirectional solidification of a eutectic alloy melt which can result in a casting having a microstructure comprising a plurality of aligned high strength lamellae or fibres of a first phase embedded in a second phase matrix. Castings prepared from alloy compositions which exhibit eutectiferous behavior are known to be useful in this respect although true (invariant) eutectic compositions suffer from the disadvantage that they are relatively inflexible in that the volume fraction of the phases and the composition of the phases are both fixed by the invariant eutectic equilibrium.

It is possible to apply unidirectional solidification techniques to alloy compositions which deviate from the invariant composition, and to produce a microstructure consisting of aligned phases of a different volume fraction to that of the true invariant eutectic, and therefore having different properties. Such a technique, however, only provides limited scope for varying the properties of a material which is required to cope with many different conditions such as those experienced in a gas turbine environment. However, it is known that the disadvantages associated with invariant eutectics can be overcome by resort to alloy compositions which solidify in accordance with a monovariant eutectic reaction. This type of system differs from a true eutectic system in that it involves, in a ternary system for example, a three phase equilibrium between the melt and two solids from which a two-phase eutectic structure is formed over a temperature and composition range. An invariant ternary eutectic reaction, on the other hand, involves the solidification of all three phases at one specific temperature.

The accompanying drawing depicts an example of a monovariant ternary eutectic system which comprises two binary eutectics (B-C, C-A) with a third binary being isomorphous and providing a range of solid solution (A-B). Eutectiferous behavior is observed along the line $E_1-E_2$ and by varying the melt along the line different volume fractions of phases can be produced. The composition of the two eutectic phases can be varied within the range $E_1-E_2$.

Other examples of monovariant ternary eutectic systems are those in which only one of the binary systems is eutectiferous and the other two isomorphous and those having a minimum in the liquids between at least two of the components and a eutectic binary.

Many different alloy compositions exhibiting monovariant eutectiferous behavior have been proposed and used in the production of castings by unidirectional solidification techniques. However, if the castings are to be employed in gas turbine engine parts for example, the castings must exhibit a combination of properties including high temperature strength (tensile and creep), corrosion resistance including general oxidation resistance and cyclic oxidation resistance, thermal stability, ductility and impact resistance. In addition, the density of the casting should not be excessively high. Heretofore, insofar as I am aware, currently available castings have lacked fully satisfactory levels of desired properties.

It has now been discovered that desired properties are achieved with a casting having special microstructural and compositional characteristics.

It is an object of the present invention to provide a heat-resistant casting.

Other objects and advantages of the invention will become apparent from the following description and the accompanying drawing.

Castings according to the invention comprise a monovariant nickel-chromium-molybdenum eutectic alloy composition which is segregated into a matrix phase having dispersed therein a fibrous phase comprising a plurality of substantially aligned lamellae and wherein the casting alloy composition contains 20% to 40% chromium and 15% to 30% molybdenum and the alloy balance, except for incidental elements and impurities, is nickel. If desired, the balance may also include up to 30% cobalt, up to 0.05% carbon, up to 5% aluminum, e.g. 16 min. 1976 up to 5% titanium, up to 5% niobium and up to 5% tantalum with the proviso that the maximum total content of aluminum, titanium, niobium and tantalum is 6%. These optional constituents, except cobalt (which functions essentially in the same manner as nickel in the castings), should be regarded as supplementary additions to the basic monovariant eutectic composition for imparting a particular additional property to the castings.

All percentages quoted in this specification, including the claims, are by weight.

With regard to the molybdenum content, less than 15% does not provide adequate strength levels in the solidified castings; preferably the alloys contain at least 18% or 20% molybdenum. However, the molybdenum content must not exceed 30% to avoid unacceptably high density levels and preferably does not exceed 25%.

At least 20% chromium is required for adequate corrosion resistance and at least 25% or even 28% is preferred. However in order that a eutectic composition is obtained and the balance of other constituents not upset whilst maintaining the desired properties, the chromium content must not exceed 40% and is preferably less than 35%.

Castings having the nominal composition of 20% molybdenum and 34% chromium are particularly preferred.

With regard to the optional constituents which may be present in the castings, it has been found that an addition of aluminum or titanium for the purpose of cleansing the melt prior to casting to provide a residual content of up to 0.5%, for example 0.1%, aluminum or titanium is very beneficial. The presence of larger amounts of aluminum in the castings, i.e., up to 5%, as well as the optional presence of one or more of the elements titanium, niobium or tantalum in amounts of up to 5% of each can also be beneficial to the castings because, coupled with the relevant heat treatment, they can provide $\gamma'$ (gamma prime) precipitation hardening of the matrix. However the total amount of these four elements must not exceed 6%. Preferably none of these elements is present in an amount exceeding 2.5% of each, and most preferably not exceeding 2.0% of each; furthermore, it is advantageous that the total content of the four elements does not exceed 3%.

In certain circumstances, cobalt may be present, i.e., replace nickel, in amounts up to 30%. However, it is preferred that the cobalt content does not exceed 20%. Carbon can be tolerated in amounts up to 0.05% and can be of benefit in respect of creep ductility.

Small amounts of other elements commonly associated with general casting practice but which do not interfere with alignment of the phases during casting may also be present. They include recognized amounts of yttrium, and rare earth elements, for example in amounts as low as 0.03%, which can improve oxidation resistance and of boron and zirconium, for example in amounts as low as 0.005%, which can improve creep ductility. Furthermore, small additions of calcium or magnesium or other cleansing elements may be used as alternatives to the aluminum or titanium additions mentioned above.

These and other such additions should be regarded as being incidental elements.

Within this composition range, it is of course necessary for the alloys to possess a basic monovariant eutectic composition. The characteristics exhibited by such alloys are well known to skilled metallurgists. However, it will be appreciated that slight deviations from the basic monovariant eutectic composition are also included within the scope of this invention. Castings whose composition does deviate in this way will generally solidify with a microstructure of the desired anisotropy but which contains some pro-eutectic crystals in a random or uniform dispersion.

The imposition of plane front unidirectional growth produced by variations in the basic casting parameters (temperature gradient and freezing rate) can, however, eliminate such pro-eutectic crystal growth again to produce an aligned two-phase microstructure which has a different volume fraction of the phases than the true monovariant composition.

Again, to those skilled in the art it is recognized that the variation of the basic casting parameters can alter the spacing between the eutectic phases thus providing a further means of varying the properties of the resultant aligned eutectic alloy.

The casting technique required to produce castings in accordance with the invention are well-known and documented. Specifically, we have employed apparatus in which pre-cast stick of the desired composition is melted by graphite assisted induction heating and thereafter unidirectionally solidified along a temperature gradient. This involves placing the pre-cast stick in a mold, the base of which is formed by a water-cooled copper disc fixed to a retractable platform, melting the lower part of the stick by means of a furnace positioned around the lower part of the stick and comprising a graphite ring surrounded by an induction coil, and allowing the melt to solidify along the temperature gradient set up in the mold by withdrawing the mold out of the furnace at a rate commensurate with obtaining the desired microstructure in the casting. As the mold is withdrawn, further parts of the stick are melted and unidirectional solidification of the stick therefore occurs on a continuous basis. Supplementary cooling means can be placed around the casting as it solidifies to ensure that the temperature gradient is maintained.

It will be appreciated that the properties of the resulting casting, particularly the strength, will depend in respect of a particular casting on the rate at which it is withdrawn from the furnace. In general, the faster a casting is withdrawn, the higher is the strength, with, of course, the proviso that lamellae alignment must be maintained.

Representative monovariant eutectic alloys which can be solidified by this technique to yield castings of the invention are shown below with their respective eutectic data:

TABLE I

| Alloy No. | Nominal Alloy comp. + (% by weight) | | Eutectic liquidus $E_L$ (° C) | Eutectic Solidus $E_S$ (° C) | $E_L - E_S$ (° C) |
|---|---|---|---|---|---|
| | Cr | Mo | | | |
| 1 | 40 | 15.5 | 1328 | 1323 | 5 |
| 2 | 33 | 20 | 1314 | 1311 | 3 |
| 3 | 27 | 25.6 | 1308 | 1303 | 5 |

+ balance essentially nickel

The above data in TABLE I illustrate the relatively high melting points of the eutectic compositions in the monovariant eutectic range. Also shown are relatively small differences between the eutectic liquidus and solidus temperatures which can contribute to the ease with which aligned two phase eutectic growth is achieved.

In general, castings of the invention solidified at a withdrawal rate of the order of 1.4 cm/hour and prepared from alloys containing at least 15% molybdenum exhibit a 100 hour life at 816° C. under a load of 462 N/mm$^2$ (Newtons per square millimeter), a 1000 hour life at 816° under a load of 365 N/mm$^2$ and a 100 hour life at 1093° C. under a load of 86 N/mm$^2$; alloys containing at least 20% molybdenum exhibit a 100 hour life at 816° C. under a load of 580 N/mm$^2$, a 1000 hour life at 816° C. under a load of 483 N/mm$^2$ and a 100 hour life at 1093° C. under a load of 100 N/mm$^2$.

The following results demonstrate the combination of desired properties exhibited by castings of the invention.

EXAMPLE I

Pre-cast stick of Alloy Nos. 4 to 6 having the composition shown in Table II, was unidirectionally cast in the apparatus described above to produce cylindrical castings of the invention 120mm. long and 18mm. in diameter. Specific withdrawal rates of the castings from the apparatus were of the order of 1.4 cm/hr. Test pieces 12mm. long and 12mm. in diameter were formed from the castings by machining and surface grinding.

TABLE II

| Alloy No. | Cr% | Mo% | Al% | Ni |
|---|---|---|---|---|
| 4 | 39.6 | 16.0 | 0.08 | bal |
| 5 | 33.6 | 20.6 | 0.12 | bal |
| 6 | 26.5 | 25.6 | 0.13 | bal |

After degreasing, the test pieces were weighed and put in a furnace under static air conditions at the temperature shown in Table III below. The test pieces were withdrawn from the furnace after the time shown and reweighed. The weight loss per unit surface area is also shown in Table III.

TABLE III

| Alloy No. | Temp. (° C) | Time (hrs.) | Weight Change (mg/cm²) |
|---|---|---|---|
| 4 | 1200 | 100 | − 12.6 |
| 4 | 1200 | 100 | − 10.0 |
| 5 | 1200 | 100 | − 10.6 |
| 5 | 1200 | 100 | − 11.6 |
| 6 | 1200 | 100 | − 10.9 |
| 6 | 1200 | 100 | − 17.8 |
| 4 | 1100 | 100 | − 1.8 |
| 5 | 1100 | 100 | + 1.2 |
| 6 | 1100 | 100 | + 0.9 |
| 4 | 850 | 1000 | + 0.76 |
| 5 | 850 | 1000 | − 0.41 |
| 6 | 850 | 1000 | + 0.26 |
| 4 | 1200 | 200 | − 4.5 |
| 5 | 1200 | 200 | − 2.6 |
| 6 | 1200 | 200 | − 5.6 |

These results indicate the excellent corrosion resistance in terms of static oxidation resistance particularly at the very high temperature of 1200° C. These results are thought to be especially surprising in a molybdenum-containing alloy in view of the catastrophic oxidation of other molybdenum-containing alloys normally exhibited under these conditions.

These tests compared extremely well with a commercially-available, high corrosion resistant alloy, IN-657, containing nominally 50% chromium, 48.5% nickel and 1.5% niobium. In a similar test, at 1200° C. the weight loss for this 50% chromium alloy was 11.9 mg/cm².

EXAMPLE II

Specimens of further alloys of the invention, Nos. 7 to 9 having the compositions shown in Table IV were prepared in the same manner as in Example I and were placed in a crucible and completely immersed in a mixture of 80% vanadium pentoxide and 20% sodium sulphate.

TABLE IV

| Alloy No. | Cr% | Mo% | Ni |
|---|---|---|---|
| 7 | 39.5 | 15.4 | bal |
| 8 | 33.3 | 20.3 | bal |
| 9 | 26.9 | 25.4 | bal |

The crucible, with the specimens, pentoxide and sulfate, was then placed in a furnace at 940° C. for the time shown in Table V. Weight losses per unit surface area are also shown in Table V.

TABLE V

| Alloy No. | Time (hrs) | Wt. Loss (g/cm²) |
|---|---|---|
| 7 | 17 | 0.33 |
| 8 | 17 | 0.63 |
| 9 | 17 | 1.00 |

EXAMPLE III

Further castings having the composition shown in Table VI were prepared in the manner described in Example I. Cylindrical test pieces were machined from the castings with the test piece longitudinal axis parallel to the lamellae having a gauge diameter of 3.18mm and a gauge length of 22.9mm and subjected to stress rupture tests under the conditions shown in Table VII.

TABLE VI

| Alloy No. | Cr% | Mo% | Al% | Ni |
|---|---|---|---|---|
| 10 | 39.6 | 16.0 | 0.08 | bal |
| 11 | 33.6 | 20.6 | 0.12 | bal |
| 12 | 26.5 | 25.6 | 0.13 | bal |
| A | 46.5 | 4.9 | 0.19 | bal |

TABLE VI-continued

| Alloy No. | Cr% | Mo% | Al% | Ni |
|---|---|---|---|---|
| B | 42.6 | 9.5 | 0.19 | bal |

Castings of the different Alloys A and B in Table VI were also prepared in a manner comparable to that used for castings of Alloy Nos. 10 to 12 of the invention.

TABLE VII

| Alloy No. | Load (N/mm²) | Temp (° C) | Life (hrs) | Elongation (%) |
|---|---|---|---|---|
| 10 | 345 | 816 | 601+ | ND |
| 10 | 83 | 1093 | 119.7 | ND |
| 10 | 124 | 1093 | 4.9 | ND |
| 11 | 552 | 816 | 141.8 | ND |
| 11 | 124 | 1093 | 32.7 | 7.9 |
| 11 | 207 | 1093 | 5.6 | 4.4 |
| 12 | 552 | 816 | 91.3 | 1.5 |
| 12 | 124 | 1093 | 60.0 | 4.3 |
| 12 | 207 | 1093 | 6.6 | 3.3 |
| A | 200 | 816 | 7.7 | 24.0 |
| A | 345 | 816 | 0.1 | 50.9 |
| A | 69 | 1093 | 0.2 | ND |
| B | 83 | 1093 | 0.4 | 13.8 |

+ indicates test discontinued
ND indicates not determined

These tests demonstrate the excellent creep properties attained by the castings of the invention containing between 15 and 30% molybdenum as compared with castings containing less than 15% molybdenum.

Further stress-rupture tests were conducted on a casting having the composition (Alloy No. 13) 25.4% chromium, 23.8% molybdenum, 1.8% aluminum, balance nickel, this casting being considered comparable to that of Alloy No. 12 with an aluminum addition to provide α' precipitation hardening of the matrix after a heat treatment of 4 hours at 1100° C., air cool, plus 16 hours at 850° C., air cool. Under a load of 552 N/mm² at 816° C., a test piece exhibited a life of 281.6 hours and an elongation of 3.4%; and, under a load of 124 N/mm² at 1093° C., a similar test piece exhibited a life of 30.3 hours and an elongation of 4.0%. These two results demonstrate an improvement in the intermediate temperature (816° C.) creep life resulting from the γ' hardening effect without any substantial loss of high temperature (1093° C.) creep life.

EXAMPLE IV

In order to demonstrate the stability of the eutectic structure of castings of the invention, tests were conducted on test pieces similar to those described in Example I. In a first test, pieces of castings having the composition of Alloys Nos. 2 and 3 were soaked at 100 hours at 1200° C. and then water quenched to ambient temperature to observe any lamellae coarsening characteristics. Essentially no coarsening was observed.

In subsequent tests, two pieces of the same castings (Nos. 2 and 3) were soaked for 1000 hours, one of each at 750° C. and one of each at 850° C. and then air cooled. Such tests showed, particularly in respect to Alloy No. 3, the possibility of precipitation hardening of the solid solution matrix. However, precipitation of massive phases, for example sigma phase, which would be detrimental to strength, was not observed.

Furthermore, the density of the castings can be a critical factor in utility as, for example, turbine blades. Generally, castings of the invention have been found to have a density up to 9.5 g/cm³ which appears to be acceptable, particularly in conjunction with high strength turbine discs prepared, for example, by advanced powder metallurgy routes.

Although the present invention has been described in conjunction with preferred embodiments, it is to be understood that modifications and variations may be resorted to without departing from the spirit and scope of the invention as those skilled in the art will readily understand. Such modifications and variations are considered to be within the purview and scope of the invention and appended claims.

I claim:

1. A directionally solidified casting comprising a basically monovariant nickel-chromium-molybdenum eutectic alloy composition segregated into a matrix phase within which is dispersed a fibrous phase comprising a plurality of substantially aligned lamellae, said alloy composition consisting essentially of 20% to 40% chromium, 15% to 30% molybdenum, up to 30% cobalt, up to 0.05% carbon, up to 5% aluminum, up to 5% titanium, up to 5% niobium and up to 5% tantalum, provided the total content of aluminum, titanium, niobium and tantalum does not exceed 6%, and with the balance, except for incidental elements and impurities, being nickel.

2. A casting according to claim 1 containing no more than 2% aluminum, no more than 2% titanium, no more than 2% niobium and no more than 2% tantalum, with the proviso that the total content of aluminum, titanium, niobium and tantalum does not exceed 3%.

3. A casting according to claim 1 containing at least 20% molybdenum.

4. A casting according to claim 1 containing no more than 25% molybdenum.

5. A casting according to claim 1 containing at least 25% chromium.

6. A casting according to claim 1 containing no more than 35% chromium.

7. A casting according to claim 1 containing about 20% molybdenum, about 34% chromium, and balance essentially nickel.

8. A casting according to claim 2 containing 20% to 25% molybdenum.

9. A casting according to claim 2 containing 25% to 35% chromium.

10. A casting according to claim 1 containing about 25.4% chromium, 23.8% molybdenum, 1.8% aluminum and balance nickel.

* * * * *